United States Patent [19]

Harada et al.

[11] Patent Number: 5,616,257
[45] Date of Patent: Apr. 1, 1997

[54] WIRE BONDING METHOD AND APPARATUS

[75] Inventors: Koichi Harada, Iruma; Kuniyuki Takahashi; Iwao Takahashi, both of Musashimurayama, all of Japan

[73] Assignee: Kabushiki Kaisha Shinkawa, Tokyo, Japan

[21] Appl. No.: 407,139

[22] Filed: Mar. 20, 1995

[30] Foreign Application Priority Data

Mar. 18, 1994 [JP] Japan .................................. 6-072943

[51] Int. Cl.⁶ ..................................................... B23K 31/00
[52] U.S. Cl. ..................................... 219/56.21; 219/145.21
[58] Field of Search ............................ 219/56.22, 56.21, 219/145.21

[56] References Cited

U.S. PATENT DOCUMENTS

| | | |
|---|---|---|
| 3,715,561 | 2/1973 | Hammarlind ..................... 219/145.21 |
| 3,950,631 | 4/1976 | Schmidt et al. . |
| 4,523,071 | 6/1985 | Bancroft et al. ..................... 219/56.21 |
| 4,549,059 | 10/1985 | Kamijo et al. ........................ 219/56.21 |
| 4,594,493 | 6/1986 | Harrah et al. ......................... 219/56.21 |
| 5,110,032 | 5/1992 | Akiyama et al. ..................... 219/56.21 |

FOREIGN PATENT DOCUMENTS

| | | |
|---|---|---|
| 46-42609 | 1/1972 | Japan . |
| 57-21325 | 5/1982 | Japan . |
| 5-102233 | 4/1993 | Japan . |

*Primary Examiner*—Clifford C. Shaw
*Attorney, Agent, or Firm*—Koda and Androlia

[57] ABSTRACT

An electrode used in a wire bonding method and apparatus for applying an electric discharge to an end of a bonding wire so as to form a ball at the end of the bonding wire. The electrode is provided with an obliquely cut surface at one end so that the end of the electrode is in a semicircular shape, and an edge area of the semicircular end surface is positioned to face upward and used as an electric discharge part. The electrode can be covered by a ceramic material except for the semicircular end surface.

5 Claims, 4 Drawing Sheets

WIRE BONDING METHOD AND APPARATUS

BACKGROUND OF THE INVENTION

1. Field of the Invention

The present invention relates to a wire bonding method and apparatus that forms a ball at the tip of a bonding wire by applying a high voltage across the tip of the wire and an electrode.

2. Prior Art

Conventional electrodes used in wire bonding apparatuses are disclosed in, for example, Japanese Patent Application Laid-Open (Kokai) No. 47-859 (called "Conventional Example 1"), Japanese Utility Model Application Publication (Kokoku) No. 57-21325 (called "Conventional Example 2"), and Japanese Patent Application Laid-Open (Kokai) No. 5-102233 (called "Conventional Example 3").

In the electrode of Conventional Example 1, the tip end of the electrode 13 has a truncated cone shape, and the flat surface at the tip of this truncated cone is used as an electric discharge part. In the electrode of Conventional Example 2, the electrode 10 has an inclined flat surface or inclined and curved surface with respect to the axial line of the wire so as to be used as an electric discharge part. In the case of the electrode 17 of Conventional Example 3, the flat upper surface of the electrode is used as an electric discharge part. The flat upper surface is covered with an insulating film except for a certain area of the flat surface.

Generally, the charge for an electrical discharge tends to concentrate at edge sections or projecting portions of electrodes. However, in all of the conventional electrodes described above, the discharge parts are flat or curved. Accordingly, there is no place for the charge to concentrate, and the force of the discharge is therefore weak. Thus, since a strong discharge cannot be obtained in a short period of time, the discharge is unstable, and the ball to be formed is also unstable. In other words, the formed balls are unstable in diameter.

FIG. 6 shows an existing conceivable approach to overcome such diameter differences or unstable balls. In this prior art, an electrode 4 is made from a round bar, and the tip end is of a sharp conical shape. In FIG. 6, reference numeral 1 indicates a bonding wire which passes through a capillary 2, and a ball 6 is formed when a high voltage from a high-voltage generator 3 is applied via the electrode 4 to the tip of the wire 1 so that a discharge 5 occurs. If the discharging part of the electrode 4 is thus formed into a sharp conical shape, the charge can concentrate at the sharp tip. Thus, it would appear that a strong discharge could be obtained in a short period of time so that balls 6 formed at the tip of the wire is consistent in diameter.

However, experiment indicates that the discharge to the wire also occurs from the side surfaces and undersurface of the tip end of the electrode. Thus, the discharge is not stable, and the balls are not in the same diameter. Furthermore, since the electrode is usually formed from an extremely hard substance, e.g., tungsten, high-precision working is extremely difficult. Accordingly, when the material is worked so as to form the end thereof into a conical shape, projections referred to by reference numeral 7 caused by irregular working may remain on the electrode. The result is that a discharge occurs from these projections 7, enabling a stable electric discharge.

Furthermore, when a strong discharge is required so as to reduce the ball diameter variations, it is necessary to limit the area of the discharge part of the electrode to as narrow an area as possible. Accordingly, the tip end of the electrode must be worked into as sharp a conical shape as possible. However, when the tip end of the electrode is formed into a sharp conical shape, the volume of the tip end is greatly reduced, and the speed at which a discharge-induced wear progresses is increased, resulting in that the useful life of the electrode is shortened.

SUMMARY OF THE INVENTION

Accordingly, the object of the present invention is to provide a wire bonding method and apparatus that includes an electrode which can provide a stable electric discharge so that the ball variation is small, the electrode can be worked easily so that the cost of the electrode can be small, and the electrode has an extended useful life.

The method according to the present invention is to form a ball at the tip of a bonding wire by applying a high voltage across the tip of the wire and an electrode so that a discharge takes place, and the feature of the invention is to use an electrode that has a semicircular end, and an edge portion near one corner of the semicircular end is positioned facing upward so that the electric discharge occurs from the edge portion of the electrode to the bonding wire, thus forming a ball at the end of the wire.

The method according to the present invention is to form a ball at the tip of a bonding wire by applying a high voltage across the tip of the wire and an electrode so that a discharge takes place, and the another feature of the invention is to use an electrode that has an angular shaped end, and an edge portion near a corner of the angular shaped end is positioned to face upward so that the electric discharge occurs from the edge portion of the electrode to the bonding wire, thus forming a ball at the end of the wire.

In addition, the apparatus of the present invention is to form a ball at the tip end of a wire by applying a high voltage across the tip of the wire and an electrode so that a discharge occurs, and the feature of the invention is that the electrode is provided with an electric discharge part that is obtained by cutting a tip end of a round rod so as to form a semicircular surface at the tip end so that an edge portion near one corner of the semicircular end surface is used as an electric discharge part.

In addition, the apparatus of the present invention is to form a ball at the tip end of a wire by applying a high voltage across the tip of the wire and an electrode so that a discharge takes place, and another feature of the invention is that the tip end of the electrode has an angular shape, so that an edge portion near a corner of the angular-shaped end of the electrode is used as an electric discharge part.

In the apparatus of the present invention, the electrode may be covered by a heat-resistant insulating cover such as a ceramic cover except for the electric discharge part.

As describe above, in the methods and apparatuses described above, the electrode used therein has the edge portion which is the electric discharge part at the end thereof.

Accordingly, the electric charge is concentrated at the edge portion so that a strong discharge can be created quickly. As a result, the electric discharge is stable, and balls of equal diameter are constantly obtained.

Furthermore, since the edge portion is near the semicircular end surface the cylindrical electrode, ample volume can be secured thereat without sharpening the edge portion to any great extent. Accordingly, wear progresses slowly, and the useful life of the electrode is prolonged.

In addition, the electrode has a shape that includes an obliquely cut surface and a semicircular end surface at the tip end thereof, or it is shaped so that the tip end of the electrode has an angular shape. Accordingly, working to obtain the electrodes is extremely easy, and the working costs can be low. The problems of residual projections caused by irregular working are eliminated, and a stable electric discharge is ensured.

The electric discharge part which is the edge portion of the electrode can be adjusted to a desired size by the use of the cover placed on the electrode, and any discharge from other part of the electrode than the edge portion is completely prevented by the cover. Thus, an electric discharge with even greater stability is obtainable.

The cover used in the present invention is made of a ceramic material, for instance. Since ceramic has a high dielectric constant compared to air, the density of the equal voltage curve or the equipotential curve can be low in the areas near the ceramic, and discharge hardly occurs in such areas. On the other hand, the density is high in the edge portion of the electrode which is not covered by the cover. Accordingly, the discharge can be easily concentrated in the edge portion.

DETAILED DESCRIPTION OF THE INVENTION

Figure 1:
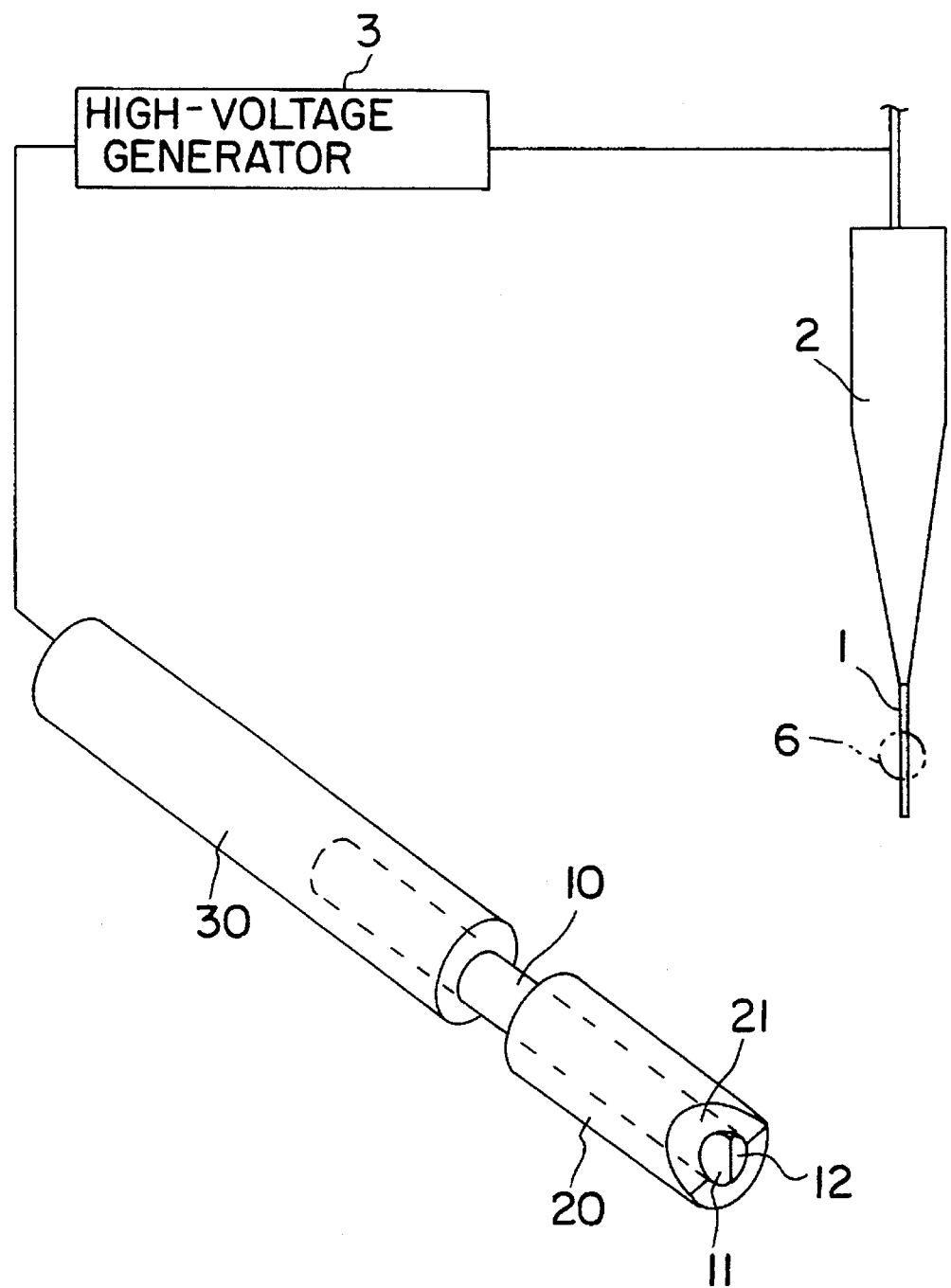
FIG. 1 is a schematic diagram and perspective view representing one embodiment of the wire bonding apparatus of the present invention.

Embodiments of the present invention will be described with reference to FIGS. 1 through 4.

The reference numeral 10 represents an electrode of the present invention. The electrode 10 is substantially a round or cylindrical bar having a curved circumferential surface, and a flat cut surface 11 is formed in the electrode 10. The cut surface 11 is obtained by cutting one end (which is the tip or front end) of the round bar perpendicularly and obliquely toward the other end (which is the rear end) of the bar. In other words, the tip end surface (which is the right side end in FIG. 2 and is perpendicular to the round rod) of the electrode 10 is cut obliquely from a center line of the round end surface of the electrode 10 towards the other end (which is the left side end in FIG. 2). As a result, a semicircular end surface 12 is obtained. The semicircular end surface 12 is perpendicular to the axis of the electrode 10.

The angle which the semicircular end surface 12 and the oblique cut surface 11 forms is, for example, about 135 degrees.

Figure 3:
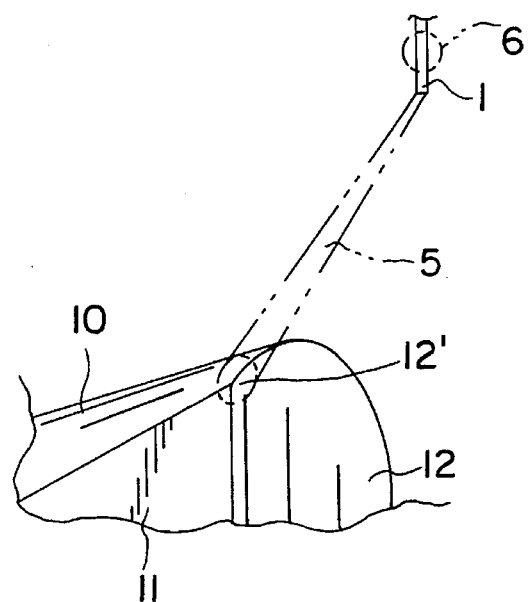
FIG. 3 is an explanatory diagram of the discharge part of the electrode used in the present invention.

A point X where the flat cut surface 11, the flat semicircular end 12 and the curved circumferential surface of the electrode 10 meet together forms an edge portion 12' which is an electric discharge part so that an electric discharge occurs from this edge portion 12'. In other words, an electric discharge is caused to occur from the electric discharge part which is near one corner of the semicircular end surface 12. In use, the electrode 10 is positioned so that the edge potion 12' which is the electric discharge part faces upward under the bonding wire 1 as shown in FIG. 3. In other words, the electrode 10 is positioned in use so that the ridge line 10L between the semicircular end surface 12 and the cut surface 11 is vertical.

Figure 6:
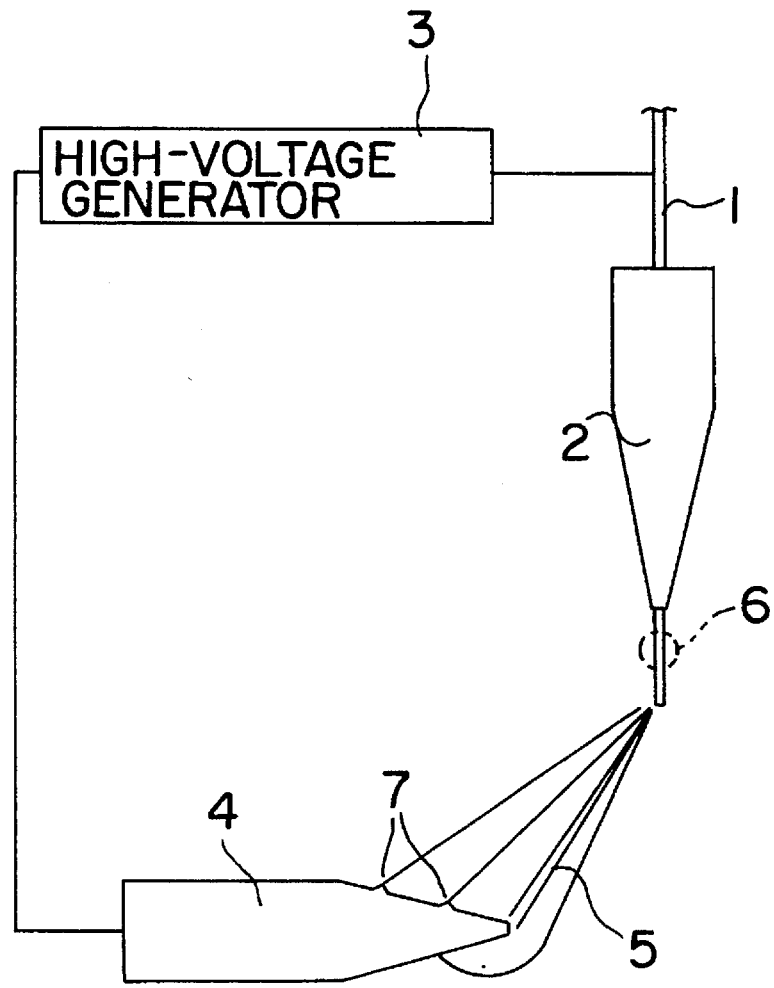
FIG. 6 is a schematic front view illustrating a prior art wire bonding.

As seen from the above, the electrode 10 has a shape which is obtained by merely forming the cut surface 11 obliquely toward the rear end thereof so as to form the semicircular end surface 12 and the edge portion 12'. Thus, working to obtain such a shape can be performed extremely easily, and the working cost can be low. Furthermore, there are no remaining residual projections that are caused by irregular working as seen in the conical electrode 4 shown in FIG. 6. Accordingly, a stable electric discharge 5 can be assured.

Moreover, since the electrode 10 has the edge portion 12' which is a point where the three surfaces meet, the electric charge is concentrated at the edge portion 12', and a strong discharge 5 can be created quickly, producing a stable discharge and therefore stable balls 6 at the end of the bonding wire 1. In other words, the balls created by the stable electric discharges that are provided by the electrode of the present invention are equal or "stable" in diameter. Moreover, since the edge portion 12' is obtained by the semicircular end 12, an ample volume, compared to the tip portion of the prior art conical electrode 4 shown in FIG. 6, can be obtained without sharpening the edge portion 12 to any great extent. Thus, the progress of wear is slow, and the useful life is prolonged.

The circumferential surface of the thus obtained electrode 10 is covered by a cover 20. The cover 20 is a cylindrical cap having heat resistance and insulating properties such as ceramic materials. The cover 20 is provided with a cut surface 21 formed by obliquely cutting the upper half of the end of the cap into a semicircular shape. Thus, when the cover 20 is put on the electrode 10, only the electric discharge part which is the edge portion 12' of the electrode 10 is not covered or is left open because of the obliquely-cut semicircular surface 21.

Figure 4A:
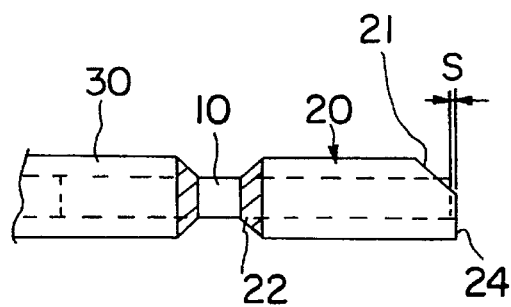
FIG. 4(a) is a front view of the electrode.

The cover 20 is fastened to the electrode 10 by means of adhesive 22. The tip surface or the front end of the electrode 10 is positioned so that it does not protrude beyond the tip end surface 24 of the cover 20. In other words, as shown in FIG. 4(a), the tip end or the end surface 12 of the electrode 10 is retracted by a distance S, which is in the range of 0 to 0.5 mm, from the end surface 24 of the cover 20.

Figure 2:
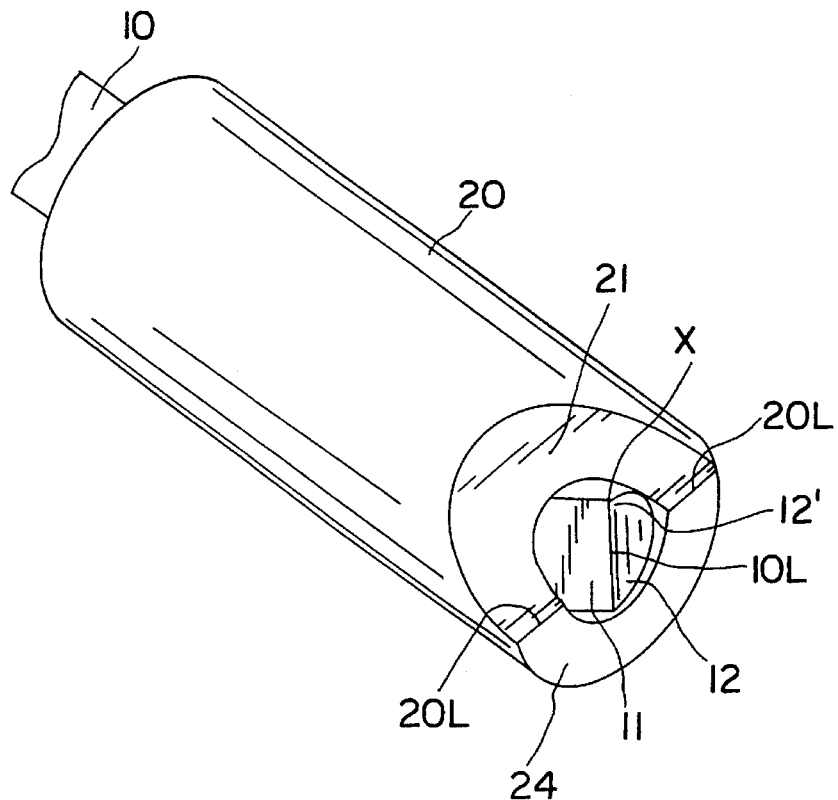
FIG. 2 is an enlarged perspective view of the essential portion in FIG. 1.
Figure 4C:
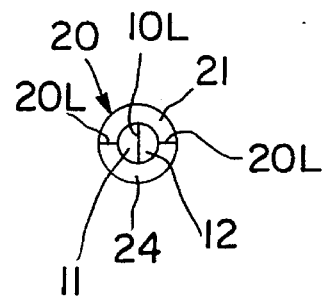
FIG. 4(c) is a right-side view thereof.
Figure 4B:
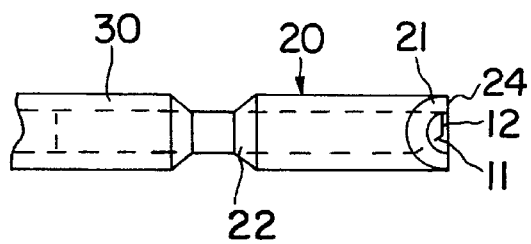
FIG. 4(b) is a top view thereof.

The positional relationship between the electrode 10 having the cut surface 11 and the cover 20 having the cut surface 21 are shown in FIGS. 4(b) and 4(c). It is preferable that the ridge line 10L defined by the cut surface 11 and the semicircular end 12 of the electrode 10 and the ridge lines 20L defined by the cut surface 21 and the tip surface 24 of the cover 20 cross at right angles as best shown in FIG. 2 and in FIG. 4(c). In other words, the electrode 10 is set so that two corners of the semicircular end 12 are vertically located.

The cover 20 may not be a cap. It can be formed by coating the electrode 10 with a coating material.

With the use of the cover 20, the size of a discharge region which is around the edge portion 12' of the electrode 10 can easily be adjusted to a predetermined or desired amount by changing the distance S. Furthermore, any discharge that might occur from the undersurface of the electrode 10 is completely shut off by the cover 20. Thus, the discharge can be stable even further.

If a ceramic is used for the cover 20, since the ceramic has a high dielectric constant compared to air, the density of the equipotential curve can be low in areas near the ceramic. As a result, no discharge would occur in such areas. To the contrary, the density is high in the edge portion 12' of the electrode 10 which is not covered by the cover 10 and exposed to air. Accordingly, the discharge is concentrated in the edge portion 12'.

In use, the electrode 10 covered by the cover 20 is fastened to a conductive connecting rod 30 by soldering. As seen from FIG. 1, a high voltage is transmitted through the connecting rod 30 from the high-voltage generator 3 and is applied to the tip of the wire 1, which protrudes from the lower end of the capillary 2, by the electrode 10 as an electric discharge 5 as shown in FIG. 3. The ball 6 is thus formed at the lower end of the wire 1.

Figure 5:
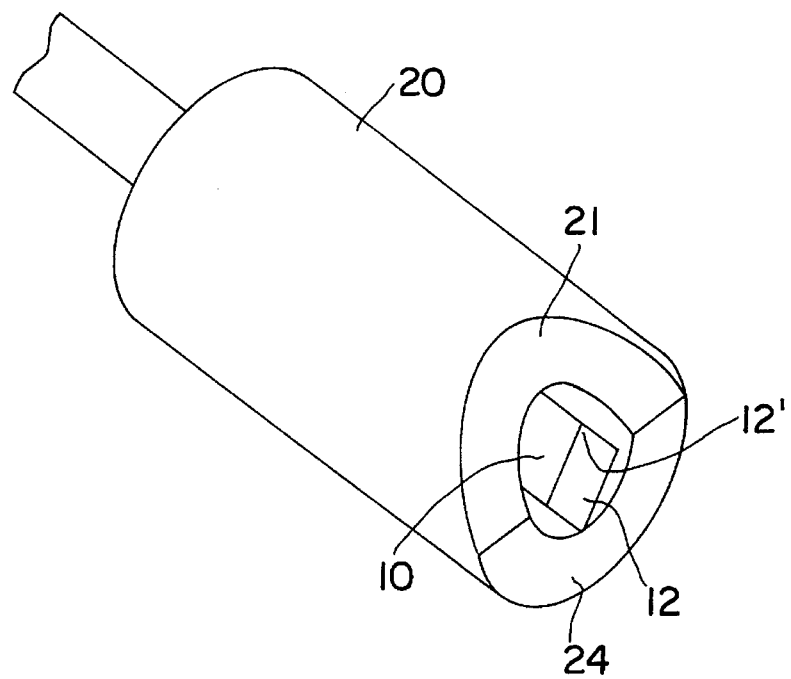
FIG. 5 is a schematic perspective view illustrating another embodiment of the wire bonding apparatus of the present invention.

FIG. 5 illustrates a second embodiment of the present invention.

The electrode 10 of the second embodiment has a square shape. More specifically, the electrode 10 is a pillar of a square cross section, and an angular shaped end 12 is positioned facing upward so that an edge portion 12' which is a point where three flat surfaces (two side surfaces and the end surface) of the electrode 10 meet together is used an electric discharge part.

In this embodiment, as in the embodiment described in FIGS. 1 through 3, the electrode 10 can be manufactured by flat cutting process. Thus, working is extremely easy, and working costs can be largely reduced. Furthermore, there are no residual projections caused by irregular working as in the case of the prior art conical electrode shown in FIG. 6. Accordingly, the electric discharge by the electrode 10 shown in FIG. 5 is stable. Moreover, since the electrode 10 has the edge portion 12', the electric charge is concentrated at this edge portion 12', and a strong discharge is created in a short period of time. In addition, the discharge is stable, and stable balls are therefore obtained.

The circumferential surface of the electrode 10 is covered by the cover 20 as shown in FIG. 5. The cover 20 has heat resistance and insulating properties, and a cut surface 21 is formed by cutting obliquely the upper half of the tip end 24 of a cap into a semicircular shape. The thus obtained cover 20 is fitted on the electrode 10 by an adhesive material. When the cover 20 is thus fixed, the edge portion 12' or the discharge part is exposed and not covered by the cover 20 as seen in FIG. 5 because of the semicircular cut surface 21.

The discharge region which is around the edge portion 12' of the electrode 10 can be adjusted to a predetermined or preferred size by the cover 20 by adjusting the distance S as in the embodiment previously described. Any discharge that might occur from the undersurface of the electrode 10 is completely prevented by the cover 20, and the discharge can be stabilized even further.

The cover 20 may be obtained by coating the electrode 10 with a coating material, not using a cap. With the coating, a more desirable assembly is obtained, since no gap is left between the electrode 10 and the coating cover 20.

Though the electrode 10 of the second embodiment is in a square shape for its entirety, it would also be possible to form only the front or tip end portion into a square cross section with other portion of the electrode has a round cross section. In short, it is sufficient if the discharge part that is located at the end of the electrode is angular in shape, and there are no particular restrictions in the shape for the rest of the electrode. Thus, for example, it would be possible to form the end of a round bar into a peak shape so that the end is in angular shape.

As seen from the above, according to the present invention, the electric discharge is stabilized, and variation in the ball diameter is reduced. Furthermore, working is easy so that a reduction in the manufacturing cost can be accomplished, and the useful life of the electrode is prolonged. In addition, the electrode can be covered with a heat-resistant insulating cover so that only the discharge part of the electrode is uncovered or left open. With this structure, the discharge region on the edge area of the electrode can easily be adjusted to a desired or a predetermined size, and any discharge that might occur from the undersurface of the electrode is completely prevented. Thus, the discharge can be stabilized even further, and a strong discharge can be obtained. Moreover, if the cover is formed of a ceramic, the discharge can be concentrated in the edge portion to an even greater degree.

We claim:

1. A wire bonding apparatus wherein a ball is formed at a tip end of a bonding wire by applying only a high voltage across said tip end of said wire and an electrode so that a discharge takes place, said apparatus being characterized in that said electrode is a cylindrical rod having tip and rear ends and said tip end of said cylindrical rod is cut perpendicularly to a cylindrical axis of said cylindrical rod and obliquely toward a rear end thereof so that an end surface of said tip end is formed in a semicircular shape, said semicircular shaped end surface having a peripheral facing upward so as to be used as an electric discharge part.

2. A wire bonding apparatus wherein a ball is formed at a tip end of a bonding wire by applying only a high voltage across said tip end of said wire and an electrode so that a discharge takes place, said apparatus being characterized in that said electrode is made of a cylindrical rod having a tip end thereof cut perpendicularly to a longitudinal axis of said cylindrical rod and obliquely toward a rear end thereof so that an end portion of said tip end is formed into a semicircular shape, said semicircular shaped end portion having an edge near a corner of said semicircular shaped end portion so as to face upward and to be used as an electric discharge part, and a circumference of said electrode it covered by a heat-resistant insulating cover except for said discharge part.

3. A wire bonding apparatus according to claim 2, wherein said cover is made of a ceramic material.

4. An electrode used in a wire bonding apparatus which forms a ball at an end of a bonding wire by applying from below an electric discharge from said electrode to said end of said bonding wire, wherein said electrode is in a cylindrical shape and is provided at one end thereof with an obliquely cut end portion and a semicircular end surface of said obliquely cut end portion which is perpendicular to longitudinal axis of said electrode so that said semicircular end surface and a curved outer surface of said electrode meet together to form an edge which faces upward and is used as an electric discharge part for said electric discharge.

5. An electrode according to claim 4, wherein said electrode is covered by a ceramic cover except for said discharge part.

\* \* \* \* \*